(12) United States Patent  (10) Patent No.: US 8,294,228 B2
Peng et al.  (45) Date of Patent: Oct. 23, 2012

(54) MAGNETIC TUNNEL JUNCTION HAVING COHERENT TUNNELING STRUCTURE

(75) Inventors: Xilin Peng, Bloomington, MN (US); Konstantin Nikolaev, Edina, MN (US); Taras Pokhil, Arden Hills, MN (US); Victor Sapazhnikov, Minnetonka, MN (US); Yonghua Chen, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 13/465,182

(22) Filed: May 7, 2012

(65) Prior Publication Data

US 2012/0217598 A1   Aug. 30, 2012

Related U.S. Application Data

(62) Division of application No. 12/501,535, filed on Jul. 13, 2009, now Pat. No. 8,183,653.

(51) Int. Cl.
*H01L 29/82* (2006.01)
*G11C 11/02* (2006.01)

(52) U.S. Cl. . 257/421; 257/422; 257/427; 257/E29.323; 438/3; 360/324.2; 365/157; 365/158

(58) Field of Classification Search .......... 257/421–427, 257/E29.323; 438/3; 360/324–326; 365/157–158
See application file for complete search history.

(56) References Cited

U.S. PATENT DOCUMENTS

| | | | |
|---|---|---|---|
| 6,714,444 B2 | 3/2004 | Huai | |
| 6,829,161 B2 | 12/2004 | Huai | |
| 6,838,740 B2 | 1/2005 | Huai | |
| 6,847,547 B2 | 1/2005 | Albert | |
| 6,888,742 B1 | 5/2005 | Nguyen | |
| 6,933,155 B2 | 8/2005 | Albert | |
| 6,958,927 B1 | 10/2005 | Nguyen | |
| 6,967,863 B2 | 11/2005 | Huai | |
| 6,985,385 B2 | 1/2006 | Nguyen | |
| 6,992,359 B2 | 1/2006 | Nguyen | |
| 7,057,921 B2 | 6/2006 | Valet | |
| 7,088,609 B2 | 8/2006 | Valet | |
| 7,110,287 B2 | 9/2006 | Huai | |
| 7,126,202 B2 | 10/2006 | Huai | |
| 7,161,829 B2 | 1/2007 | Huai | |
| 7,190,611 B2 | 3/2007 | Nguyen | |
| 7,230,845 B1 | 6/2007 | Wang | |
| 7,233,039 B2 | 6/2007 | Huai | |
| 7,241,631 B2 | 7/2007 | Huai | |
| 7,242,045 B2 | 7/2007 | Nguyen et al. | |

(Continued)

OTHER PUBLICATIONS

Wang et al., Deposition of In-Plane Textured MagO on Amorphous $Si_3N_4$ Substrates by Ion-Beam-Assisted..., Appl. Phys. Lett. 71 (20) Nov. 17, 1997.

(Continued)

*Primary Examiner* — Jami M Valentine
(74) *Attorney, Agent, or Firm* — Mueting Raasch & Gebhardt PA

(57) ABSTRACT

A magnetic tunnel junction includes an amorphous ferromagnetic reference layer having a first reference layer side and an opposing second reference layer side. The first reference layer side has a greater concentration of boron than the second reference layer side. A magnesium oxide tunnel barrier layer is disposed on the second side of the amorphous ferromagnetic reference layer. The magnesium oxide tunnel barrier layer has a crystal structure. An amorphous ferromagnetic free layer is disposed on the magnesium oxide tunnel barrier layer.

20 Claims, 4 Drawing Sheets

U.S. PATENT DOCUMENTS

| | | |
|---|---|---|
| 7,242,048 B2 | 7/2007 | Huai |
| 7,245,462 B2 | 7/2007 | Huai |
| 7,351,483 B2 | 4/2008 | Parkin |
| 7,369,427 B2 | 5/2008 | Diao |
| 7,430,135 B2 | 9/2008 | Huai |
| 7,486,551 B1 | 2/2009 | Li |
| 7,486,552 B2 | 2/2009 | Apalkov |
| 7,489,541 B2 | 2/2009 | Pakala |
| 7,518,835 B2 | 4/2009 | Huai |
| 7,576,956 B2 | 8/2009 | Huai |
| 2006/0221510 A1 | 10/2006 | Parkin |
| 2008/0124454 A1 | 5/2008 | Djayaprawira |
| 2008/0182015 A1 | 7/2008 | Parkin |
| 2008/0191295 A1 | 8/2008 | Ranjan |
| 2009/0050991 A1 | 2/2009 | Nagai |
| 2009/0302403 A1 | 12/2009 | Nguyen |

OTHER PUBLICATIONS

Djayaprawira et al., 230% Room-Temperature Magnetoresistance in CoFeB/MgO/CoFeB Magnetic Tunnel Junctions, Appl. Phys. Lett. 86, 092502 (2005).

Yuasa et al., Giant Room-Temperature Magnetoresistance in Single-Crystal Fe/MgO/Fe Magnetic Tunnel Junctions, 2004 Nature Publishing Group.

Luborsky et al., Crystallization Kinetics of Fe-B Amorphous Alloys, Appl. Phys. Lett. 33 (3), Aug. 1, 1978.

Takeuchi et al., Crystallization of Amorphous CoFeB Ferromagnetic Layers in CoFeB/MgO/CoFeB Magnetic Tunnel Junctions, Japanese Journal of Applied Physics, vol. 46, No. 25, 2007, pp. L623-L626.

MAGNETIC TUNNEL JUNCTION HAVING COHERENT TUNNELING STRUCTURE

RELATED APPLICATIONS

This application is a divisional of U.S. patent application Ser. No. 12/501,535, filed Jul. 13, 2009. The entire disclosure of this application is incorporated herein by reference.

BACKGROUND

A basic component of a magnetic tunnel junction (MTJ) is a sandwich of two thin ferromagnetic layers separated by a very thin insulating layer through which electrons can tunnel. The tunneling resistance is often lower when the magnetic moments of the ferromagnetic layers are parallel and higher when the magnetic moments of the two ferromagnetic layers are anti-parallel.

The change in conductance for these two magnetic states can be described as a magneto-resistance. The tunneling magneto-resistance (TMR) of the MTJ can be defined as $(R_{AP}-R_P)/R_P$ where $R_P$ and $R_{AP}$ are the resistance of the MTJ for parallel and anti-parallel alignment of the ferromagnetic layers, respectively. MTJ devices have been proposed as memory cells for nonvolatile solid state memory and as external magnetic field sensors, such as TMR read sensors for heads for magnetic recording systems. For a memory cell application, one of the ferromagnetic layers in the MTJ is the reference layer and has its magnetic moment fixed or pinned via a synthetic ferromagnetic (SAF) layer and an anti-ferromagnetic (AFM) layer, so that its magnetic moment is unaffected by the presence of the magnetic fields applied to the device during its operation. The other ferromagnetic layer in the sandwich is the free layer, whose moment responds to an external magnetic field applied during operation of the device. In the quiescent state, in the absence of any applied magnetic field within the memory cell, the free layer magnetic moment is designed to be either parallel (P) or anti-parallel (AP) to the magnetic moment of the reference ferromagnetic layer. For a TMR field sensor for read head applications, the reference ferromagnetic layer has its magnetic moment fixed or pinned via a synthetic ferromagnetic (SAF) layer and an anti-ferromagnetic (AFM) layer so as to be generally perpendicular to the magnetic moment of the free or sensing ferromagnetic layer in the absence of an external magnetic field.

For applications of magnetic tunnel junctions for either magnetic recording heads or for non-volatile magnetic memory storage cells, high TMR values are desired for improving the performance of these devices.

BRIEF SUMMARY

The present disclosure relates to magnetic tunnel junctions having a coherent tunneling structure. In particular, the present disclosure relates to magnetic tunnel junctions that have coherent interfaces between the magnetic layers (free layer and reference layer) and the tunnel barrier layer and methods of forming the same.

In one particular embodiment, a magnetic tunnel junction includes an amorphous ferromagnetic reference layer having a first reference layer side and an opposing second reference layer side. The first reference layer side has a greater concentration of boron than the second reference layer side. A magnesium oxide tunnel barrier layer is deposited on the second side of the amorphous ferromagnetic reference layer. The magnesium oxide tunnel barrier layer has a crystal structure. An amorphous ferromagnetic free layer is then deposited on the magnesium oxide tunnel barrier layer.

In another embodiment, a method includes the steps of depositing an amorphous ferromagnetic reference layer having a first reference layer side and an opposing second reference layer side. The first reference side has a greater concentration of boron than the second reference side. Then the method includes depositing a magnesium oxide tunnel barrier layer disposed on the second side of the amorphous ferromagnetic reference layer. The magnesium oxide tunnel barrier layer has a crystal structure. Then the method includes depositing an amorphous ferromagnetic free layer disposed on the magnesium oxide tunnel barrier layer, forming a magnetic tunnel junction.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
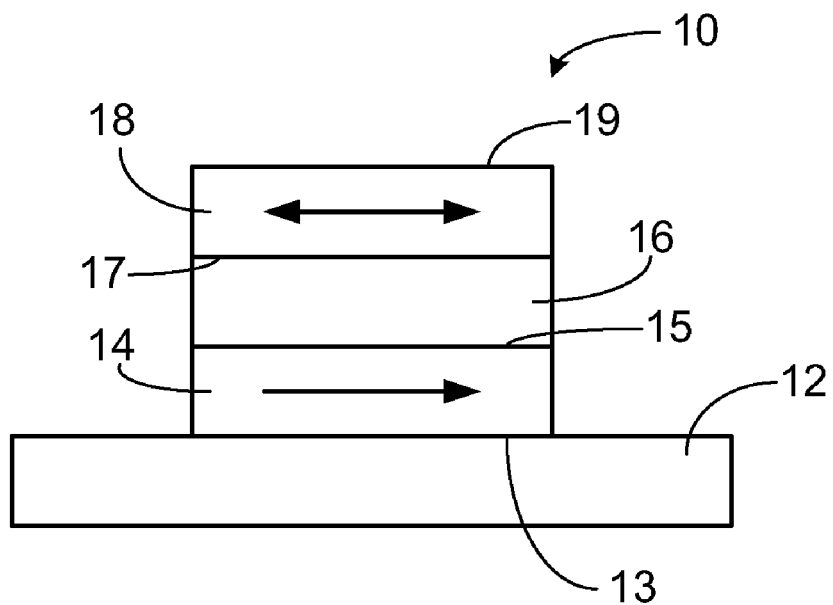
FIG. 1 is a cross-sectional schematic diagram of an illustrative magnetic tunnel junction.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to magnetic tunnel junctions having a coherent tunneling structure. In particular, the present disclosure relates to magnetic tunnel junctions that have coherent interfaces between magnetic layers (free layer and reference layer) and the tunnel barrier layer and methods of forming the same. Reducing boron concentration in the reference magnetic layer and free magnetic layer at the tunnel barrier interfaces allows the formation of coherent interfaces between these layers more easily. Coherent interfaces provide superior tunneling magnetoresistance (TMR) and lower resistance area product (RA) in the magnetic tunnel junction (MTJ) and also enable lower annealing temperatures, or better interface quality at the same annealing temperatures. The structures and methods described herein ensure crystallization (during the annealing process) of the amorphous free and reference magnetic layers initiate from the tunnel barrier crystal structure and utilize the tunnel barrier crystal structure as a template for crystal structure growth outward from the tunnel barrier. While the present disclosure is not so limited, an appreciation of various aspects of the disclosure will be gained through a discussion of the examples provided below.

For clarity, additional layers such as a capping layer, seed layer, and additional pinning or reference layers are not illustrated in the figures. It is understood that one or more of these additional layers would be present.

FIG. 1 is a cross-sectional schematic diagram of an illustrative magnetic tunnel junction 10.

As stated above, a cap layer, or additional reference layers (e.g., SAF and/or SAF) are not illustrated in these figures. The magnetic tunnel junction 10 includes an amorphous ferromagnetic reference layer 14 having a first reference layer side 13 and an opposing second reference layer side 15. The amorphous ferromagnetic reference layer 14 can be deposited on a substrate 12 such as, for example AlTiC. The first reference side 13 has a greater concentration of boron (B) than the second reference side 15. A magnesium oxide tunnel barrier layer 16 is disposed on the second side 15 of the amorphous ferromagnetic reference layer 14. The magnesium oxide tunnel barrier layer 16 has a crystal structure such as a (001) crystal structure, for example. An amorphous or nano-crystal ferromagnetic free layer 18 is disposed on the magnesium oxide tunnel barrier layer 16. The amorphous ferromagnetic free layer 18 has a first free layer side 17 and an opposing second free layer side 19. In some embodiments, the second free layer side 19 has a greater concentration of boron than the first free layer side 17. The first free layer side 17 is in contact with the magnesium oxide tunnel barrier layer 16.

The amorphous ferromagnetic reference layer 14 can be formed of any useful ferromagnetic material such as, for example, alloys of Co, Fe, and/or Ni, and the like, with elements like B, Si, Ta, Ti, Zr, Nb, and the like, and Heusler alloys (e.g., $Co_2MnSi$, $Co_2MnGe$). In many embodiments the amorphous or nano-crystal ferromagnetic reference layer 14 comprises a CoFeB material. The amorphous ferromagnetic free layer 18 can be formed of any useful ferromagnetic material such as, for example, alloys and materials including Co, Fe, and/or Ni and optionally with other elements such as Si, Ta, Ti, Zr, Nb, and the like, and Heusler alloys (e.g., $Co_2MnSi$, $Co_2MnGe$), for example. In many embodiments the amorphous ferromagnetic free layer 18 comprises a CoFeB material.

Tailoring the interfaces between the magnesium oxide tunnel barrier layer 16 and the amorphous or nano-crystal ferromagnetic free layer 18 and the amorphous ferromagnetic reference layer 14 has been found to improve the tunneling magnetoresistance (TMR) and reduce the resistance area product (RA) in the magnetic tunnel junction (MTJ) and also enables lower annealing temperatures. Forming a coherent interface (see FIG. 3A) between the magnesium oxide tunnel barrier layer 16 and the amorphous ferromagnetic free layer 18 and the amorphous ferromagnetic reference layer 14 enables higher tunneling magnetoresistance (TMR), reduced resistance area product (RA) and also enables lower annealing temperatures. The coherent interfaces can be formed by initiating crystal structure formation of the amorphous ferromagnetic layers 14, 18 at the interface with the magnesium oxide tunnel barrier layer 16 and utilizing the magnesium oxide tunnel barrier layer 16 crystal structure (such as the (001) crystal structure) as a template for crystal structure formation.

In many embodiments, the amorphous ferromagnetic layers 14, 18 are deposited such that a boron concentration in the amorphous ferromagnetic layers 14, 18 is a gradient that increases as it moves away from the magnesium oxide tunnel barrier layer 16 in a thickness direction of the amorphous ferromagnetic layers 14, 18. In many embodiments, the amorphous ferromagnetic reference layer 14 has a boron concentration gradient extending between the first reference layer side 13 and the opposing second reference layer side 15. In some embodiments, the amorphous ferromagnetic free layer 18 has a boron concentration gradient extending between the first free layer side 19 and the opposing second free layer side 17. In many embodiments, the boron concentration in the amorphous ferromagnetic layers 14 and/or 18 can range from 0 to 15% atomic at the side near the magnesium oxide tunnel barrier layer 16 and from 10 to 25% atomic at the side further from the magnesium oxide tunnel barrier layer 16.

Figure 2:
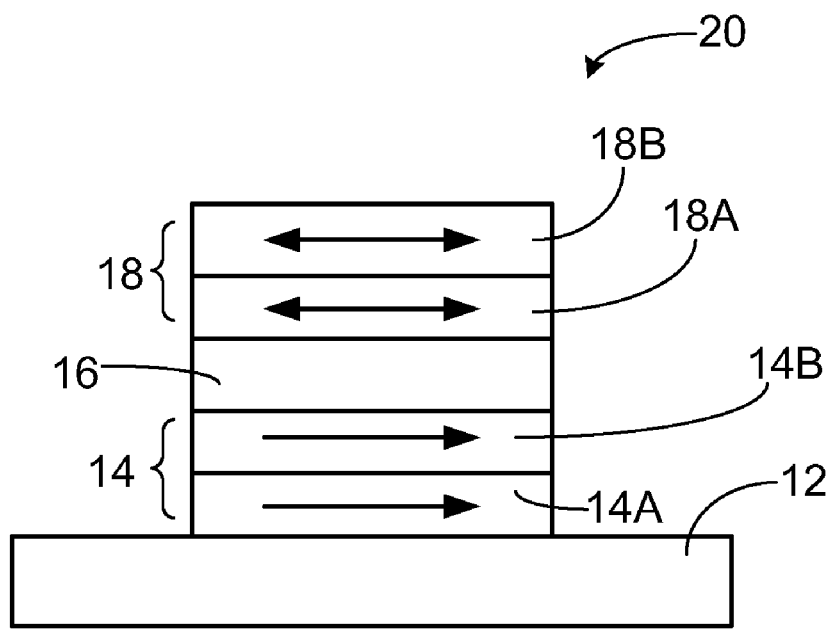
FIG. 2 is a cross-sectional schematic diagram of another illustrative magnetic tunnel junction.

FIG. 2 is a cross-sectional schematic diagram of another illustrative magnetic tunnel junction 20. The magnetic tunnel junction 20 includes a magnesium oxide tunnel barrier layer 16 separating an amorphous ferromagnetic reference layer 14 from an amorphous ferromagnetic free layer 18. The amorphous ferromagnetic reference layer 14 can be deposited on a substrate 12 such as, for example AlTiC.

In these embodiments, the amorphous or nano-crystal ferromagnetic free layer 18 and the amorphous ferromagnetic reference layer 14 can be formed of two or more sub-layers. These sub-layers can have the same or different compositions. For example, the amorphous ferromagnetic reference layer 14 is formed of a first reference sub-layer 14A having a first boron concentration and a second reference sub-layer 14B having a second boron concentration, and the first boron concentration is greater than the second boron concentration. In some embodiments the first sub-layer 14A has a greater cobalt concentration than the second sub-layer 14B. In some embodiments the second sub-layer 14B has a greater iron concentration than the first sub-layer 14A.

In some embodiments, the amorphous or nano-crystal ferromagnetic free layer 18 is formed of a first free sub-layer 18A having a first boron concentration and a second sub-layer 18B having a second boron concentration, and the second boron concentration is greater than the first boron concentration. In other embodiments, the amorphous ferromagnetic free layer 18 is formed of a first free sub-layer 18A having a CoFeB material and a second sub-layer 18B having a NiFeM (where M is any useful third alloying element enabling the amorphous nature of the alloy) amorphous magnetic material.

The ferromagnetic reference layer 14 determines the crystal structure of the magnesium oxide tunnel barrier layer 16 deposited on it. A magnesium oxide tunnel barrier layer 16 having a desired crystal structure (001) develops on an amorphous surface and not on a crystalline surface. Thus, the ferromagnetic reference layer 14 should be amorphous when the magnesium oxide tunnel barrier layer 16 is deposited on it. In some embodiments, an amorphous magnetic or non-magnetic layer can be deposited on the first reference sub-layer 14A to ensure the amorphous structure formation of the second reference sub-layer 14B. In some embodiments, the first reference sub-layer 14A and/or the second reference sub-layer 14B can be deposited at a low temperature such as, −50 degrees centigrade or less, to ensure the amorphous structure formation of the second reference sub-layer 14B.

Figure 3A:
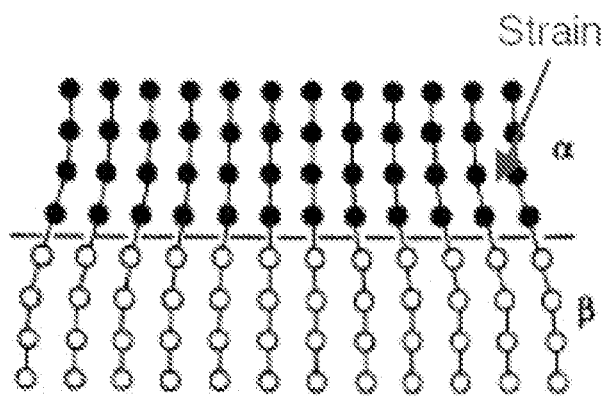
FIG. 3A is a schematic diagram of a coherent interface of two crystalline materials.
Figure 3B:
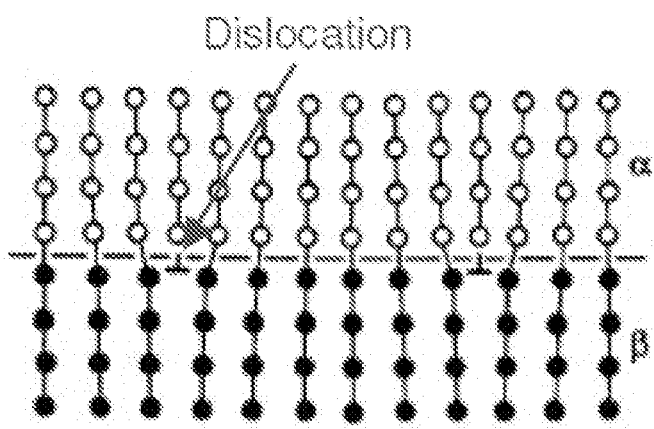
FIG. 3B is a schematic diagram of a semi-coherent interface of two crystalline materials.
Figure 3C:
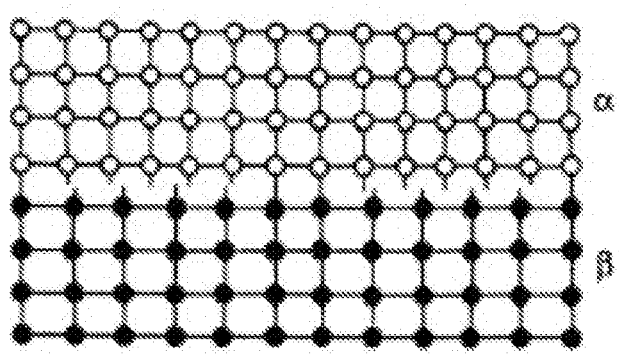
FIG. 3C is a schematic diagram of a incoherent interface of two crystalline materials.

FIG. 3A is a schematic diagram of a coherent interface of two crystalline materials. FIG. 3B is a schematic diagram of a semi-coherent interface of two crystalline materials. FIG. 3C is a schematic diagram of an incoherent interface of two crystalline materials. FIG. 3A illustrates some strain as a result of the coherent interface between the first crystal structure α and the second crystal structure β, having a different lattice constant, this is described as a coherent interface. FIG. 3B illustrates dislocations where the first crystal structure α does not line up with the second crystal structure β, this is described as a semi-coherent interface. Dislocations are formed to relieve the strain between these two crystal structures when their lattice constant mismatch is relatively larger than those in FIG. 3A. FIG. 3C illustrates a majority of dislocations where the first crystal structure α does not line up with the second crystal structure β, this is described as an incoherent interface. This is the case when the two crystal structure has a very large lattice mismatch. Coherent interfaces between the tunnel barrier and the ferromagnetic free and reference layers of a magnetic tunnel junction have been found to dramatically increase the tunneling magnetoresistance (TMR) in the magnetic tunnel junction (MTJ).

Figures 4A, 4B, 4C:
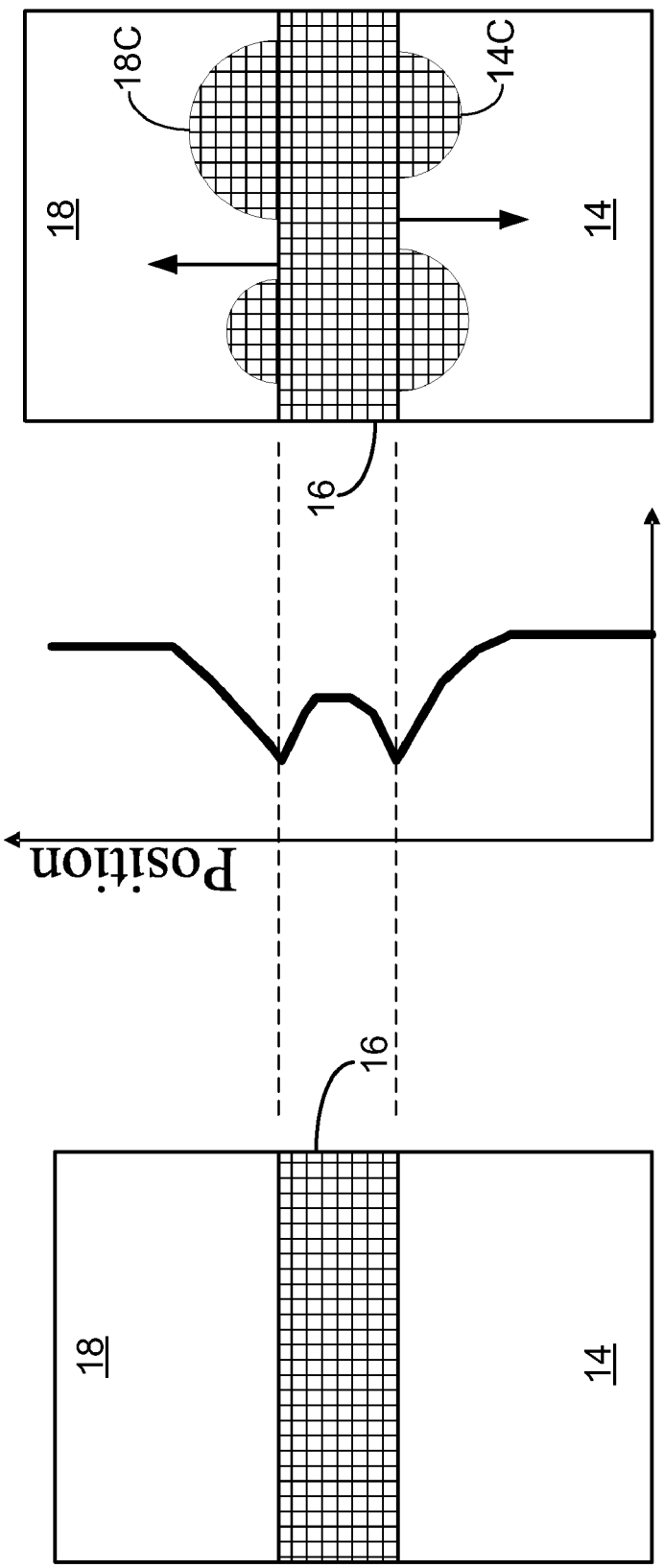
FIG. 4A is a schematic diagram of a illustrative magnetic tunnel junction prior to annealing.
FIG. 4B is a schematic diagram of an illustrative magnetic tunnel junction during annealing.
FIG. 4C is a graph of boron content as a function of position within the illustrative magnetic tunnel junction of FIG. 4A and FIG. 4B.

FIG. 4A is a schematic diagram of an illustrative magnetic tunnel junction prior to annealing. FIG. 4B is a schematic diagram of an illustrative magnetic tunnel junction during annealing. FIG. 4C is a graph of boron content as a function of position within the illustrative magnetic tunnel junction of FIG. 4A and FIG. 4B.

As described above, the magnetic tunnel junction includes a magnesium oxide tunnel barrier layer 16 separating an amorphous ferromagnetic reference layer 14 from an amorphous ferromagnetic free layer 18. The magnesium oxide tunnel barrier layer 16 possesses a (001) crystal structure. As illustrated in FIG. 4C, boron content or concentration decreases (which can be in part due to boron diffusion into the MgO barrier) at the interfaces between the magnesium oxide tunnel barrier layer 16 and the amorphous ferromagnetic reference layer 14 and the amorphous ferromagnetic free layer 18. Due to the lower boron concentration at these interfaces, crystallization initiates at these interfaces at a lower temperature and grows outward from these interfaces as illustrated in FIG. 4B. In many embodiments, crystallization initiates at these interfaces at a temperature of 325 degrees centigrade or less, or at a temperature of 300 degrees centigrade or less, or at a temperature of 275 degrees centigrade or less.

Care is taken to reduce or prevent crystallization initiation within the amorphous ferromagnetic reference layer 14 or from the Ru (within SAF) and reference interface or the amorphous ferromagnetic free layer 18 or from the free layer 18 and capping layer interface except at the interface with the magnesium oxide tunnel barrier layer 16. Thus, depositing a magnetic or non-magnetic amorphous layer adjacent to the amorphous ferromagnetic reference layer 14 and the amorphous ferromagnetic free layer 18 can assist in preventing or suppressing crystallization initiation within the amorphous ferromagnetic reference layer 14 or the amorphous ferromagnetic free layer 18 except at the interface with the magnesium oxide tunnel barrier layer 16. In some embodiments the entire ferromagnetic reference layer 14 and the ferromagnetic free layer 18 forms a crystal structure. In other embodiments, only a portion of the ferromagnetic reference layer 14 and the ferromagnetic free layer 18 forms a crystal structure.

Figure 5:
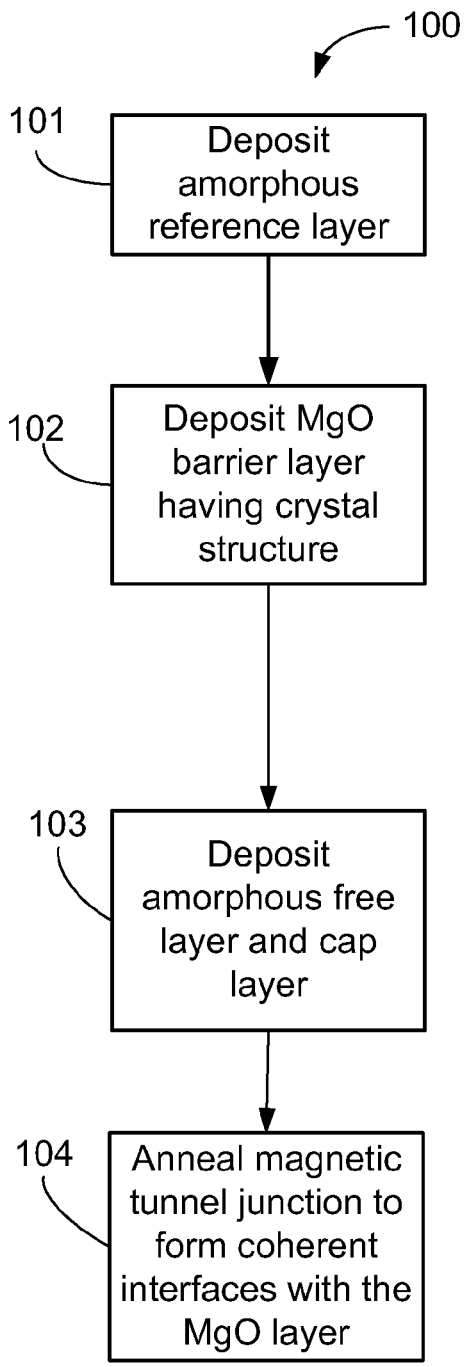
FIG. 5 is a flow diagram of an illustrative method of forming a magnetic tunnel junction having coherent interfaces.
Figure 6A:
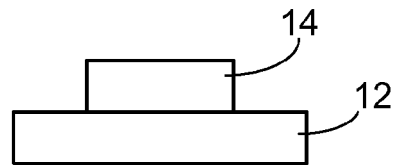
FIG. 6A-6C are schematic diagrams for forming a magnetic tunnel junction according to method described in FIG. 5.
Figure 6B:
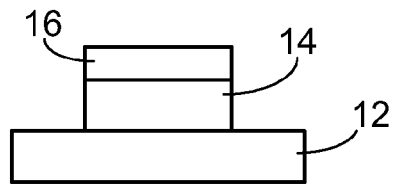
Figure 6C:
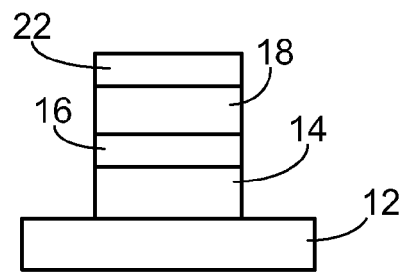

FIG. 5 is a flow diagram of an illustrative method of forming a magnetic tunnel junction having coherent interfaces. FIG. 6A-6C are schematic diagrams for forming a magnetic tunnel junction according to method described in FIG. 5. The method 100 includes depositing an amorphous ferromagnetic reference layer having a first reference layer side and an opposing second reference layer side where the first reference side having a greater concentration of boron than the second reference side at block 101. FIG. 6A illustrates the amorphous ferromagnetic reference layer 14 deposited on a substrate 12. The reference layer 14 can include a number of additional layers between the amorphous ferromagnetic reference layer 14 and the substrate 12, as further described below.

Then the method includes depositing a magnesium oxide tunnel barrier layer disposed on the second side of the amorphous ferromagnetic reference layer where the magnesium oxide tunnel barrier layer has a (001) crystal structure, at block 102. FIG. 6B illustrates the magnesium oxide tunnel barrier layer 16 on the amorphous ferromagnetic reference layer 14. An amorphous or nano-crystal free layer is then deposited on the magnesium oxide tunnel barrier layer to form a magnetic tunnel junction, at block 103. FIG. 6C illustrates the amorphous or nano-crystal free layer 18 is then deposited on the magnesium oxide tunnel barrier layer 16 and a cap layer is deposited on the amorphous or nano-crystal free layer 18. The magnetic tunnel junction is then annealed to crystallize the amorphous ferromagnetic reference and free layers, as described above, forming coherent interfaces with the magnesium oxide tunnel barrier.

In many embodiments, the amorphous ferromagnetic reference layer 14 and/or ferromagnetic free layer 18 can be deposited at a low temperature such as, −50 degrees centigrade or less, to ensure the amorphous structure formation of the amorphous ferromagnetic reference layer 14 and/or ferromagnetic free layer 18.

One particular example of a magnetic tunnel junction includes a structure described in Table 1 below, where the deposition of the layers begins with layer 1.

TABLE 1

| | Film stack | Layer # |
|---|---|---|
| Cap | Ta or Ru | 9B |
| | Ru or Ta | 9A |
| FL | $Ni_xFe_yM_z$ (amorphous magnetic layer) | 8B |
| | $Co_{x3}Fe_{y3}B_{z3}$ or other nano-crystal magnetic layers | 8A |
| MgO | MgO or Mg + OX | 7 |
| RL | $Co_{x2}Fe_{y2}B_{z2}$ or other amorphous magnetic layers | 6B |
| | $Co_{x1}Fe_{y1}B_{z1}$ or other amorphous magnetic layers | 6A |
| Ru | Ru | 5 |
| PL | $Co_{x0}Fe_{y0}$ | 4 |
| AFM | IrMn | 3 |
| Seed | Ru | 2 |
| | Ta | 1 |

$Z_3<Z_2<Z_1$ for boron content. For instance, $Z_3$=0-10%, $Z_2$=6-16%, $Z_1$=~20%. $X_1>X_2$; M can be any additives to enable amorphous NiFe alloy formation. Layer 1~5 can be conventional layers such as, seed layer, antiferromagnetic layer (AFM), pinned layer (PL), ruthenium interlayer structure (Ru), respectively. RL refers to the reference layer, and FL refers to the free layer.

Reference layer 6A, adjacent to Ru can be cobalt rich and has a high boron content to ensure an amorphous layer formation. Also, it may be desirable to have a high cobalt content to ensure strong Ruderman-Kittel-Kasuya-Yoshida (RKKY) synthetic antiferromagnetic (SAF) coupling. Reference layer 6B, adjacent to MgO layer can be iron-rich with low boron content. If grown on an amorphous template and within a desired thickness range, it will grow in an amorphous status due to the nucleation suppression when the boron content is high enough. Due to the lower boron content in 6B, it will start to crystallize at a lower annealing temperature (e.g., from 250° C. to 300° C. or 300° C. or less) and fully crystallize the reference layer (RL) starting from 6B to 6A. In some embodiments, the layer 6B has a high iron content enabling higher TMR ratio.

Lowering the deposition temperature of the reference layer (RL) is an effective way to enable amorphous growth during the deposition of both layer 6A and 6B, even with a low boron concentration.

Layer 7 is the tunnel barrier (MgO). Since (001) MgO self-texture is favored by an amorphous template, the reference layer (6B) should be amorphous to ensure good (001) MgO crystal structure growth. During annealing (either at or post deposition), the reference layer (6B and 6A) will use such (001) MgO as a template to crystallize and form coherent interface with the MgO barrier layer.

The free layer 8A is adjacent to the MgO barrier and can be made from lower boron content CoFeB, either in amorphous or nano-crystal or crystal structure to form a coherent interface with (001) MgO barrier. The free layer 8B can balance the magnetostriction of the whole free layer 8. However, it is preferred during/post annealing that crystallization does not start from the top cap layer 9/free layer 8B interface. An amorphous magnetic or non-magnetic layer can be inserted between free layer 8A and 8B to suppress the free layer crystallization from locations other than barrier and free layer 8A interface, particularly when 8B is in crystal structure. Thus, an amorphous 8B free layer is preferred. Another reason why amorphous or nano-crystalline structure in magnetic layers is preferred in the final product is that it provides a more uniform rotation of magnetization than a polycrystalline structure. In reader head applications, this can improve the reader performance by reducing asymmetry sigma. Another reason to employ an amorphous sub-layer is that it can potentially reduce mechanical stress from a top shield, thus reducing noise and improving reader head stability and symmetry. In this particular example, layer 8B is made of an NiFeM amorphous layer, it can also be CoFeB layer with high enough concentration of boron or other nanocrystal magnetic layers to prevent the crystallization of this layer even after stack anneal. Cap layer 9, can be a single or multiple layer structure, and should not induce crystallization of the whole free layer from Cap/free layer (FL) interface.

One particular example of a magnetic tunnel junction includes a structure described in Table 2 below, where the deposition of the layers begins with layer 1.

TABLE 2

| | Film stack | Layer # |
|---|---|---|
| Cap | Ta | 9B |
| | Ru | 9A |
| FL | Co-rich amorphous $Co_{x4}Fe_{y4}B_{z4}$ or other layer | 8B' |
| | Fe-rich amorphous $Co_{x3}Fe_{y3}B_{z3}$ or other layer | 8A' |
| MgO | MgO | 7 |
| RL | Fe-rich $Co_{x2}Fe_{y2}B_{z2}$ or other amorphous layers | 6B |
| | Co-rich $Co_{x1}Fe_{y1}B_{z1}$ or other amorphous layers | 6A |
| Ru | Ru | 5 |
| PL | $Co_{x0}Fe_{y0}$ | 4 |
| AFM | IrMn | 3 |
| Seed | Ru | 2 |
| | Ta | 1 |

Layer 9A and 9B are interchangeable and can be either Ta or Ru. $X_0$~70~100%; $Y_0$=0-30%; $X_1>X_2$; $Y_3>Y_4$, $Y_2>Y_1$; $Z_3<Z_2<Z_1$ for boron content. For instance, $Z_3$=0-10%, $Z_2$=6-16%, $Z_1$=~20%, $Z_4$~20%.

The above magnetic tunnel junction stacks can be annealed to form coherent interfaces between the MgO tunnel barrier and the magnetic reference layer and free layer. In addition the above magnetic tunnel junction stacks do not have non-magnetic insertion layers such as Ta, Zr, Nb, Ti, and the like, for example, within the either the reference layer (RL) or the free layer (FL), thus these layers maintain uniform magnetics. Reducing the boron concentration helps to minimize boron segregation or migration and reduces magnetic layer non-uniformity. The above magnetic tunnel junction stacks also possess improved TMR and magnetostriction as compared to conventional magnetic tunnel junction stacks.

A first magnetic tunnel junction (MTJ1) was formed having the following structure (thickness value in Angrstroms): Ta(30)/Ru(30)/IrMn(70)/$CF_{30}$(21)/Ru(8.2)/$CoFeB_{20}$(12)/$CoFeB_{12}$(13)/MgO/$CoFeB_{12}$(20)/Ta(1.5)/$NiFe_4$(37)/Ru(30)/Ta(60).

A second magnetic tunnel junction (MTJ2) was formed having the following structure (thickness value in Angrstroms): Ta(30)/Ru(30)/IrMn(70)/$CF_{30}$(21)/Ru(8.2)/$CoFeB_{12}$(25)/MgO/$CoFeB_{12}$(20)/Ta(1.5)/$NiFe_4$(37)/Ru(30)/Ta(60).

MTJ1 has a first reference layer=$CoFeB_{20}$ that is amorphous and serves as a template for amorphous growth of the second reference layer=$CoFeB_{12}$ which, in turn, promotes proper (001) MgO texture, and, as a result, a high TMR value (of about 75%) is achieved after the stack is annealed. For MTJ2 the $CoFeB_{12}$ reference layer does not form an amorphous layer when deposited directly on Ru and, as a result, MTJ2 exhibits a low TMR (of about 10%). Even if it does form an amorphous layer as-grown, its subsequent crystallization during an anneal may start from the bottom Ru layer rather than (001) MgO barrier.

A third magnetic tunnel junction (MTJ3) was formed having the following structure (thickness value in Angrstroms): Ta(12)/Ru(20)/IrMn(60)/$CF_{30}$(20)/Ru(8.2)/$(Co_{75}Fe_{25})B_{20}$ (10)/(Co$_{73}$Fe$_{27}$)B$_{10}$(13)/MgO/(Co$_{90}$Fe$_{10}$)B$_4$(17)/CoB$_{20}$(25)/ Ta(5)/Ru(30)/Ta(60). This MTJ achieved high TMR without using any non-magnetic Ta insets anywhere in the stack or NiFe as part of the free layer. The free layer is just 4.2 nm thick with a lowered boron concentration. MTJ3 possesses desirable soft magnetic properties and negative magnetostriction. Again, low boron concentrations in reference layer 2 and free layer 1 enable crystallization to start from the MgO template, thus achieving high degree of coherency and achieving high MR (of about 85%). This stack can be further modified to further reduce the amount of boron and reference layer iron for improved SAF coupling and RL/FL homogeneities.

A fourth magnetic tunnel junction (MTJ4) was formed having the following structure (thickness value in Angrstroms): Ta(12)/Ru(20)/IrMn(60)/CF$_{30}$(19)/Ru(8.2)/CoFeB$_{15}$(10)/—cool down to minus 100° C./CoFeB$_{10}$(12)/MgO/CoFeB$_8$(12)/CoB$_{20}$(40)/Ru(30)/Ta60 with a TMR of about 35%.

A fifth magnetic tunnel junction (MTJ5) was formed having the following structure (thickness value in Angrstroms): Ta(12)/Ru(20)/IrMn(60)/CF$_{30}$(19)/Ru(8.2)/—cool down to minus 100° C./CoFeB$_{15}$(10)/CoFeB$_{10}$(12)/MgO/CoFeB$_8$(12)/CoB$_{20}$(40)/Ru(30)/Ta60 with a TMR of about 85%.

These examples demonstrate the benefit of lowering the deposition temperature to achieve an amorphous CoFeB phase in the reference layer necessary to achieve a high TMR value. The stacks MTJ4 and MTJ5 are identical; the only difference is the deposition temperature of reference layer 1=CoFeB$_{15}$. Low temperature promoted a desired amorphous growth of the CoFeB$_{15}$ film and, as a result, of the reference layer 2=CoFeB$_{10}$ film grown onto the CoFeB$_{15}$ film; while a room temperature RT-deposited CoFeB$_{15}$ layer was partly crystallized, and so is the CoFeB$_{10}$ deposited onto it, even though it is processed at a lower temperature (−100° C.) in this example.

Thus, embodiments of the MAGNETIC TUNNEL JUNCTION HAVING COHERENT TUNNELING STRUCTURE are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A magnetic tunnel junction comprising:
an ferromagnetic reference layer having a first reference layer side and an opposing second reference layer side, the first reference layer side having a greater concentration of boron than the second reference layer side, and the second reference side comprising a reference layer crystal structure;
a magnesium oxide tunnel barrier layer disposed on the second side of the ferromagnetic reference layer, the magnesium oxide tunnel barrier layer having a crystal structure; and
an amorphous ferromagnetic free layer disposed on the magnesium oxide tunnel barrier layer wherein the amorphous ferromagnetic reference layer comprises a first sub-layer having a first boron concentration and a second sub-layer having a second boron concentration, and the first boron concentration is greater than the second boron concentration.

2. A magnetic tunnel junction according to claim 1, wherein the first boron concentration is a value in a range from 10 to 25% atomic and the second boron concentration is a value in a range from 0 to 15% atomic.

3. A magnetic tunnel junction according to claim 1, wherein the first sub-layer has a greater cobalt concentration the second sub-layer.

4. A magnetic tunnel junction according to claim 1, wherein the second sub-layer has a greater iron concentration the first sub-layer.

5. A magnetic tunnel junction according to claim 1, wherein the magnesium oxide tunnel barrier layer is disposed on and in direct contact with the second side of the ferromagnetic reference layer.

6. A magnetic tunnel junction according to claim 1, wherein the amorphous ferromagnetic free layer is disposed on and in direct contact with the magnesium oxide tunnel barrier layer.

7. A magnetic tunnel junction according to claim 1, wherein the first sub-layer of the amorphous ferromagnetic free layer is disposed on and in direct contact with the magnesium oxide tunnel barrier layer.

8. A magnetic tunnel junction according to claim 1, wherein the first reference layer side is amorphous.

9. A magnetic tunnel junction comprising:
a ferromagnetic reference layer having a first reference layer side and an opposing second reference layer side, the first reference side having a greater concentration of boron than the second reference side, and the second reference side comprising a reference layer crystal structure;
a magnesium oxide tunnel barrier layer disposed on the second side of the ferromagnetic reference layer, the magnesium oxide tunnel barrier layer having a magnesium oxide crystal structure, wherein the magnesium oxide crystal structure forms a coherent interface with the reference layer crystal structure; and
a ferromagnetic free layer disposed on the magnesium oxide tunnel barrier layer, the ferromagnetic free layer forming a coherent interface with the magnesium oxide crystal structure.

10. A magnetic tunnel junction according to claim 9, wherein the first reference layer side is amorphous.

11. A magnetic tunnel junction according to claim 9, wherein the ferromagnetic free layer has a first free layer side and an opposing second free layer side, the second free layer side having a greater concentration of boron than the second free side, and the first free layer side being in contact with the magnesium oxide tunnel barrier layer, and the second free layer side is amorphous.

12. A magnetic tunnel junction according to claim 9, wherein the ferromagnetic reference layer has a boron concentration gradient extending between the first reference layer side and the opposing second reference layer side.

13. A magnetic tunnel junction according to claim 11, wherein the ferromagnetic free layer has a boron concentration gradient extending between the first free layer side and the opposing second free layer side.

14. A magnetic tunnel junction according to claim 9, wherein the ferromagnetic reference layer comprises a first sub-layer having a first boron concentration and a second sub-layer having a second boron concentration, and the first boron concentration is greater than the second boron concentration.

15. A magnetic tunnel junction according to claim 14, wherein the first boron concentration is a value in a range from 10 to 25% atomic and the second boron concentration is a value in a range from 0 to 15% atomic.

16. A method comprising:
depositing an amorphous ferromagnetic reference layer having a first reference layer side and an opposing second reference layer side, the first reference side having a greater concentration of boron than the second reference side;
depositing a magnesium oxide tunnel barrier layer disposed on the second side of the amorphous ferromagnetic reference layer, the magnesium oxide tunnel barrier layer having a crystal structure; and
depositing an amorphous or nano-crystal ferromagnetic free layer on the magnesium oxide tunnel barrier layer, forming a magnetic tunnel junction.

17. A method according to claim 16, further comprising annealing the magnetic tunnel junction and initiating crystallization of the amorphous ferromagnetic reference layer at the second reference layer side and initiating crystallization of the amorphous or nano-crystal ferromagnetic free layer at an interface between the amorphous ferromagnetic free layer and the magnesium oxide tunnel barrier layer.

18. A method according to claim 17, wherein the crystallization initiates at 300 degrees centigrade or less.

19. A method according to claim 16, wherein the depositing an amorphous ferromagnetic reference layer or amorphous ferromagnetic free layer occurs at a temperature of −50 degrees centigrade or less.

20. A method according to claim 16, further comprising depositing a cap layer on the amorphous ferromagnetic free layer, the cap layer preventing or suppressing crystallization initiation at an interface between the cap layer and the amorphous ferromagnetic free layer.

* * * * *